(12) United States Patent
Groe

(10) Patent No.: US 7,157,971 B2
(45) Date of Patent: Jan. 2, 2007

(54) LOW-DISTORTION DIFFERENTIAL CIRCUIT

(75) Inventor: John B. Groe, Poway, CA (US)

(73) Assignee: Sequoia Communications, San Diego, CA (US)

( * ) Notice: Subject to any disclaimer, the term of this patent is extended or adjusted under 35 U.S.C. 154(b) by 0 days.

(21) Appl. No.: 11/209,169

(22) Filed: Aug. 20, 2005

(65) Prior Publication Data

US 2006/0077004 A1 Apr. 13, 2006

Related U.S. Application Data

(63) Continuation of application No. 10/911,227, filed on Aug. 3, 2004, now Pat. No. 6,952,133, which is a continuation of application No. 10/036,844, filed on Nov. 8, 2001, now Pat. No. 6,795,843.

(60) Provisional application No. 60/283,431, filed on Apr. 12, 2001, provisional application No. 60/246,949, filed on Nov. 8, 2000.

(51) Int. Cl.
   *H03F 3/45* (2006.01)
(52) U.S. Cl. .............................. 330/259; 330/9; 330/149
(58) Field of Classification Search ................ 330/259, 330/260, 252, 9, 149
   See application file for complete search history.

(56) References Cited

U.S. PATENT DOCUMENTS

| 6,021,323 | A  | * | 2/2000 | Vagher .................. 455/324 |
| 6,188,282 | B1 | * | 2/2001 | Montalvo ............... 330/260 |
| 6,335,655 | B1 | * | 1/2002 | Yamamoto .............. 327/552 |
| 6,586,996 | B1 | * | 7/2003 | Fanous et al. ............ 330/254 |
| 6,597,650 | B1 | * | 7/2003 | Katakura et al. ........ 369/59.22 |

* cited by examiner

*Primary Examiner*—Patricia Nguyen
(74) *Attorney, Agent, or Firm*—Daniel Tagliaferri, Esq.; Cooley Godward Kronish LLP

(57) ABSTRACT

A differential feedback system that minimizes even order distortion of a differential circuit. The feedback system includes a feedback circuit for use with a differential circuit to reduce even-order distortion and dc offset of a difference output signal produced by the differential circuit. The feedback circuit includes an integrator coupled to receive the difference output signal from the differential circuit and produce an integrator output signal. The feedback circuit also includes a control circuit coupled to the integrator to receive the integrator output signal to produce a control signal that is coupled to the differential circuit, wherein the control signal controls the differential circuit to reduce the even-order distortion and the DC offset.

9 Claims, 7 Drawing Sheets

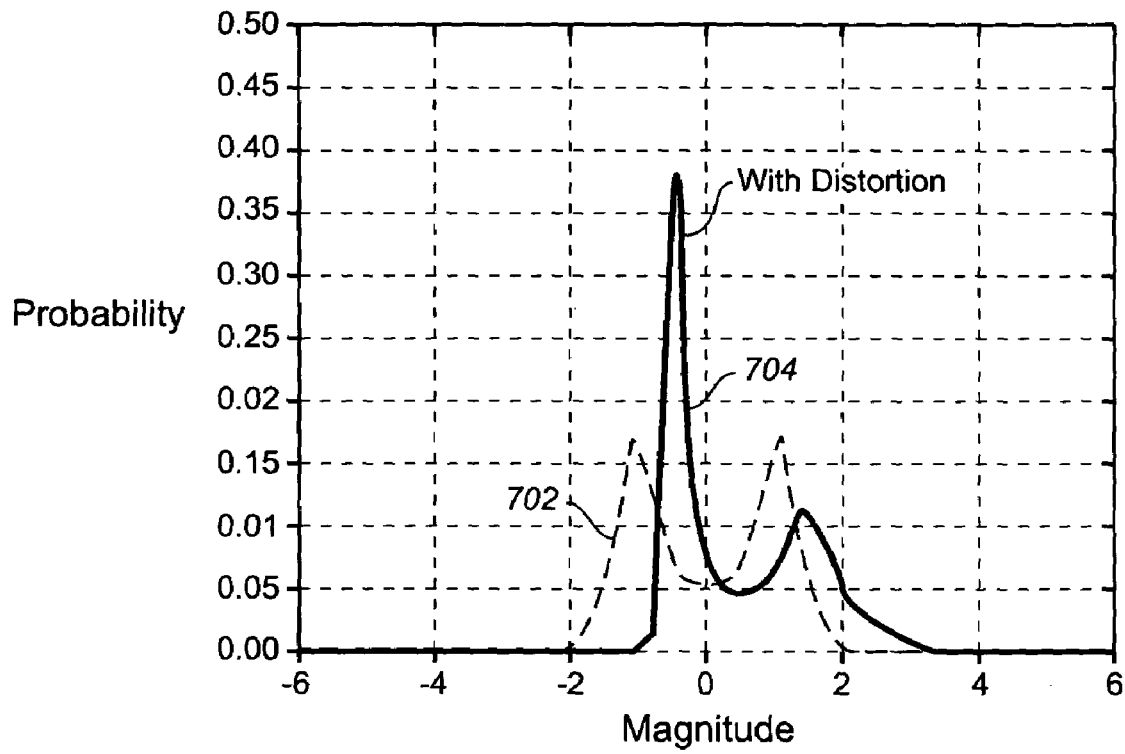
Figure 7
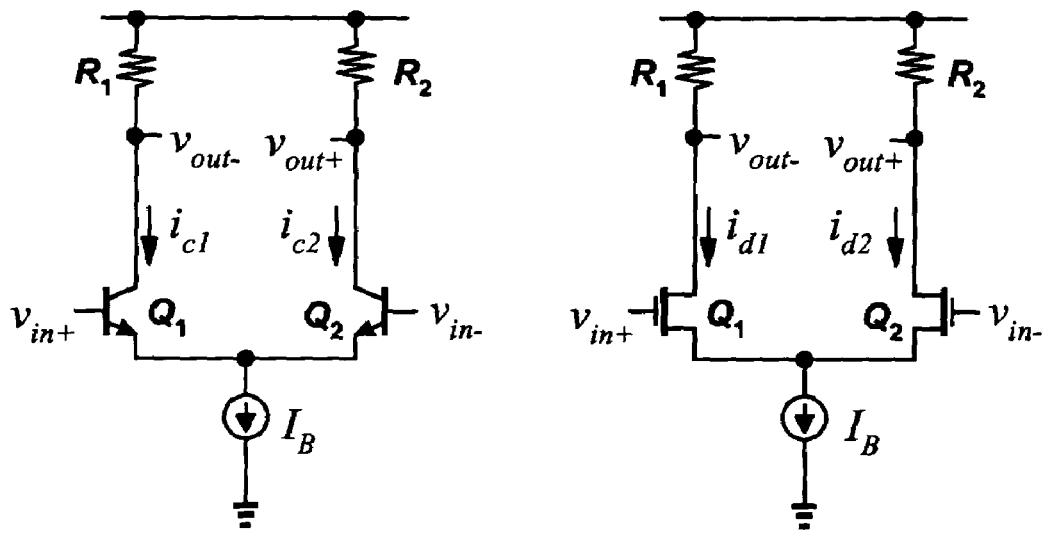
Figure 8
"PRIOR ART"
Figure 9
"PRIOR ART"

LOW-DISTORTION DIFFERENTIAL CIRCUIT

CROSS REFERENCE TO RELATED APPLICATIONS

This application is a Continuation of U.S. patent application Ser. No. 10/911,227 filed on Aug. 3, 2004, now U.S. Pat No. 6,795,133 which is a Continuation of U.S. patent application Ser. No. 10/036,844 filed on Nov. 8, 2001, now U.S. Pat. No 6,795,843. The application Ser. No. 10/036,844 claims the benefit of priority from U.S. Provisional Application No. 60/246,949 entitled "METHOD AND APPARATUS FOR LOW DISTORTION CIRCUITS" filed on Nov. 8, 2000, and U.S. Provisional Application No. 60/283,431 entitled "LOW DISTORTION CIRCUITS" filed on Apr. 12, 2001, now abandoned. The disclosures of the above-identified Provisional Patent Applications are incorporated herein in their entirety for all purposes.

FIELD OF THE INVENTION

The present invention relates generally to circuits used in communication receivers, and more particularly, to differential circuits with low even order distortion and low DC offset for use in a communication receiver.

BACKGROUND OF THE INVENTION

A differential circuit operates on the difference between two input signals. Its structure couples together two half-circuits and its performance largely depends on the symmetry between these two half-circuits.

The linearity performance of differential circuits is critical in certain applications, such as in communication receivers. Oftentimes, communication receivers must process very strong unwanted or interfering signals without corrupting the wanted or desired communication signal. In many applications, the desired communication signal can be extremely small. It would therefore be advantageous to have differential circuits with improved linearity and low distortion.

SUMMARY OF INVENTION

The present invention includes a differential feedback system that minimizes even order distortion of a differential circuit. The feedback system controls key aspects of the differential circuit, improving its symmetry—the key to the differential circuit's ability to reject even order distortion and dc offsets—and thereby extending its linearity. In one embodiment, a feedback circuit resolves even order distortion and dc offsets by analyzing the mean value of the differential circuit's output waveform, which is typically zero for most modulated signals.

In one embodiment of the present invention, a feedback circuit is provided for use with a differential circuit to reduce even-order distortion and dc offset of a difference output signal produced by the differential circuit. The feedback circuit includes an integrator coupled to receive the difference output signal from the differential circuit and produce an integrator output signal. The feedback circuit also includes a control circuit coupled to the integrator to receive the integrator output signal to produce a control signal that is coupled to the differential circuit, wherein the control signal controls the differential circuit to reduce the even-order distortion and the DC offset.

In another embodiment of the present invention, a method is provided for reducing even-order distortion and dc offset of a difference output signal produced by a differential circuit. The method includes steps of integrating the difference output signal to produce an integrated signal, translating the integrated signal to produce a control signal, and controlling the differential circuit with the control signal.

BRIEF DESCRIPTION OF DRAWINGS

The foregoing aspects and the attendant advantages of this invention will become more readily apparent by reference to the following detailed description when taken in conjunction with the accompanying drawings wherein:

FIG. 7 shows a graph that illustrates the probability distributions of a modulation signal before and after even-order distortion, thereby providing another view of the change in a signal's properties;

FIG. 8 shows a diagram of a typical simple emitter-coupled differential pair amplifier;

FIG. 9 shows a diagram of a typical simple source-coupled differential pair amplifier;

DETAILED DESCRIPTION

The present invention includes a differential feedback system that minimizes even order distortion of a differential circuit. For example, in one embodiment of the invention, the system includes a feedback circuit that resolves even order distortion and dc offsets by analyzing the mean value of the differential circuit's output waveform. Thus, various embodiments of the feedback system included in the present invention are herein discussed in detail in the following text.

There exists several different signal types with mean values that approach zero; that is, the average value of the waveform, measured over a period of time, is nearly zero, i.e.

$$E[x(n)] = \frac{\sum x_n}{n} \qquad E[x(t)] = \frac{\int x\,dt}{t}$$

Communication signals, such as the signals formed by frequency modulation and digital modulation techniques, show this property.

A frequency-modulated (FM) signal is formed by changing the instantaneous frequency of the signal s(t) according to the message signal m(t). It is described by $$s(t) = A\cos\int[\omega_c + \kappa m(t)]dt$$

where A is the amplitude, $\omega_c$ is the carrier frequency, and $\kappa$ is the modulation index. The modulated signal varies between +A and −A, with a mean value of zero.

Figure 1:
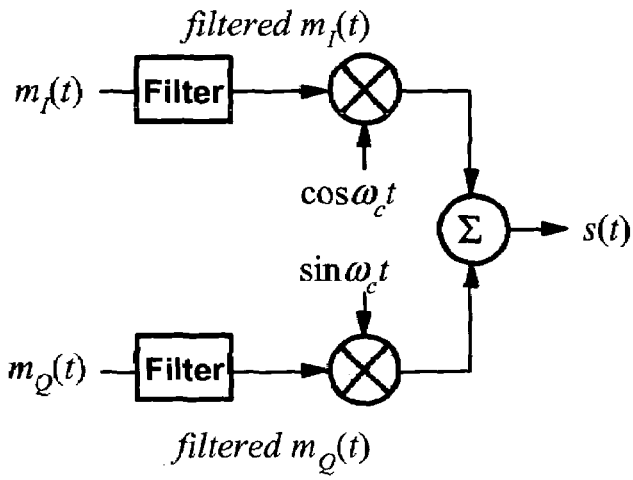
FIG. 1 shows a block diagram of a typical digital modulator.

FIG. 1 shows a block diagram of a typical I/Q modulator that forms a digitally-modulated signal. The I/Q modulator combines sine and cosine waveforms to efficiently produce phase, and in some cases, amplitude-modulated signals. The modulated signal is described by $$s(t) = A[m_I(t)\cos\omega_c t + m_Q(t)\sin\omega_c t]$$

where $m_I(t)$ and $m_Q(t)$ are the message signals (at baseband frequency). Oftentimes the message signals are filtered to shape the characteristics of the modulated signal.

Global System for Mobile (GSM) communication systems use a form of digital modulation known as Gaussian minimum shift keying (GMSK). This technique shapes the binary message data (values of ±1) with a Gaussian filter to smooth data transitions and shift the frequency of the modulated signal ±67.5 kHz. The message data is usually significantly busy to achieve a near-zero mean value. Furthermore, the Gaussian filters create a modulated signal with constant amplitude and thus a mean value equal to zero.

Figure 2:
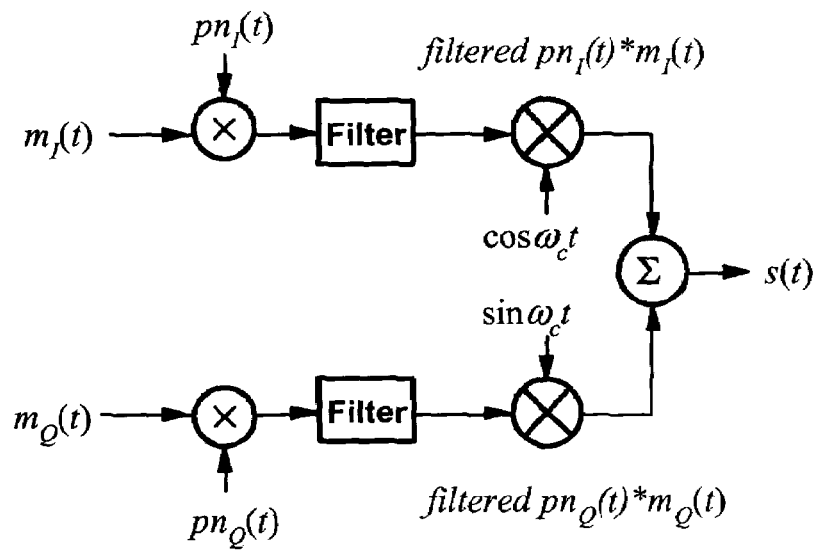
FIG. 2 shows a block diagram of a typical direct-sequence spread-spectrum digital modulator.

FIG. 2 shows a block diagram of a typical direct-sequence spread-spectrum digital modulator. Code Division Multiple Access (CDMA) systems use direct sequence spread-spectrum modulation with quarternary phase shift keying (QPSK). Direct sequence spread spectrum modulation randomizes the message data by multiplying it by pseudo-random (PN) sequences. This guarantees the spread data to be significantly busy with a mean value of zero. CDMA communication systems also include filters to shape the modulation spectrum. For example, some CDMA systems employ 46-tap finite impulse response (FIR) filters designed to restrict the bandwidth of the modulation signal.

Figure 3:
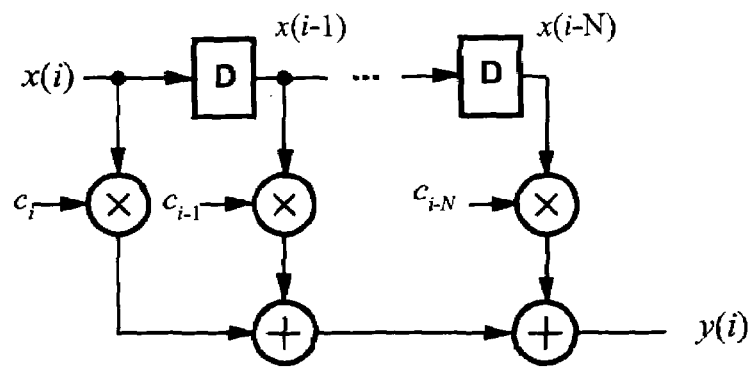
FIG. 3 shows a diagram of the typical structure of a finite impulse response (FIR) digital filter.

FIG. 3 shows a diagram of the typical structure of a finite impulse response (FIR) digital filter. The FIR filters are linear, equal-phase filters, and their operation can be described by the following equation $$y(n) = c_0 x(n) + c_1 x(n-1) + \ldots c_{N-1} x(n-N+1)$$

where $c_i$ are the filter tap weights and $x(n)$ is the input data sequence. Since each tap weight eventually multiplies each sample of the input sequence, the mean value of the output is still zero when measured over a long period of time. CDMA systems based on WCDMA use root raised-cosine pulse-shaping filters. These filters shape the digital pulses in such a way as to minimize intersymbol interference. As with any linear filter, the mean value of the data remains unchanged and thus zero. The mean value analysis can be extended to higher order modulation systems.

Figure 4A:
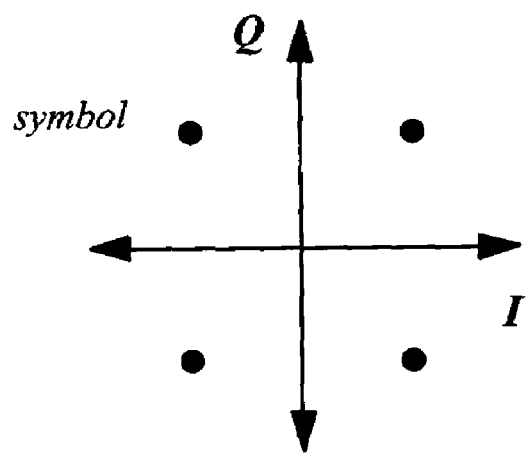
FIGS. 4a–c illustrate several communication constellation diagrams and their zero-value geometric mean.
Figure 4B:
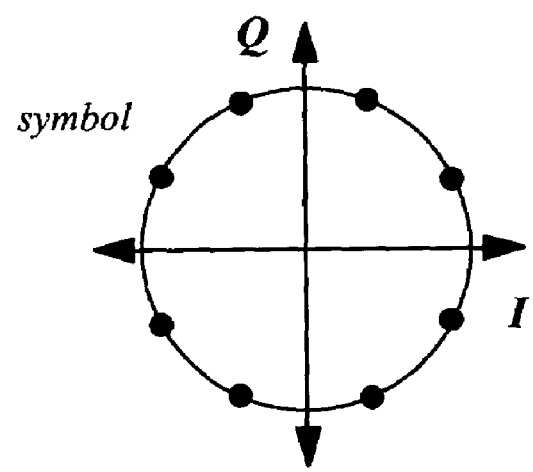
Figure 4C:
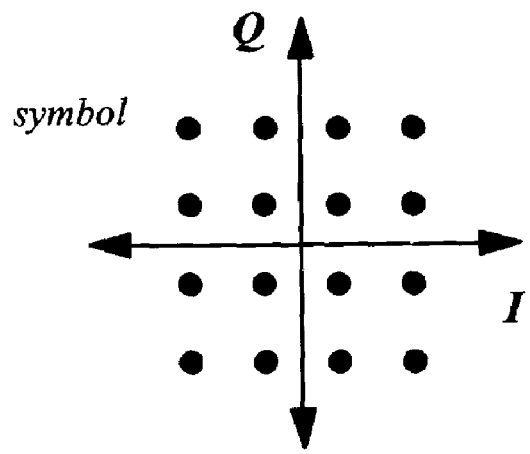

FIGS. 4a–c illustrate several communication constellation diagrams and their zero-value geometric mean. The constellation diagrams—plots of the communication symbols at distinct points in time on the I/Q plane—are shown in FIG. 4a for a QPSK modulation system, in FIG. 4b for a MPSK (M-ary phase shift keying) modulation system, and in FIG. 4c for a 16-QAM (quadrature amplitude modulation) system. The geometric mean of each constellation diagram is given by $$\vec{m}_{i,q} = \sum \vec{i}_{i,q} + \sum \vec{q}_{i,q}$$

where the arrow indicates vector quantities. In each case, the geometric mean, and thus the mean value of an arbitrary (and random) message signal is zero.

When a modulation signal is subjected to even order distortion, its mean value is altered. Consider a modulated signal described generally by the following;

$$s(t) = m_I(t)\cos\omega_c t + m_Q(t)\sin\omega_c t$$

and subjected to distortion from a nonlinear circuit, modeled by a Taylor series expansion given as $$v_{out} = \alpha_1 v_{in} + \alpha_2 v_{in}^2 + \alpha_3 v_{in}^3 + \ldots$$

where coefficients $\alpha_i$ represent distortion. The squared term becomes;

$$a_2 v_{in}^2 = a_2 \left[ \frac{m_I^2(t)}{2}(1+\cos 2\omega_c t) + \frac{m_Q^2(t)}{2}(1+\sin 2\omega_c t) \right]$$

which shows the message signal translated to both baseband and two times the carrier frequency ($\omega_c$).

Figure 5:
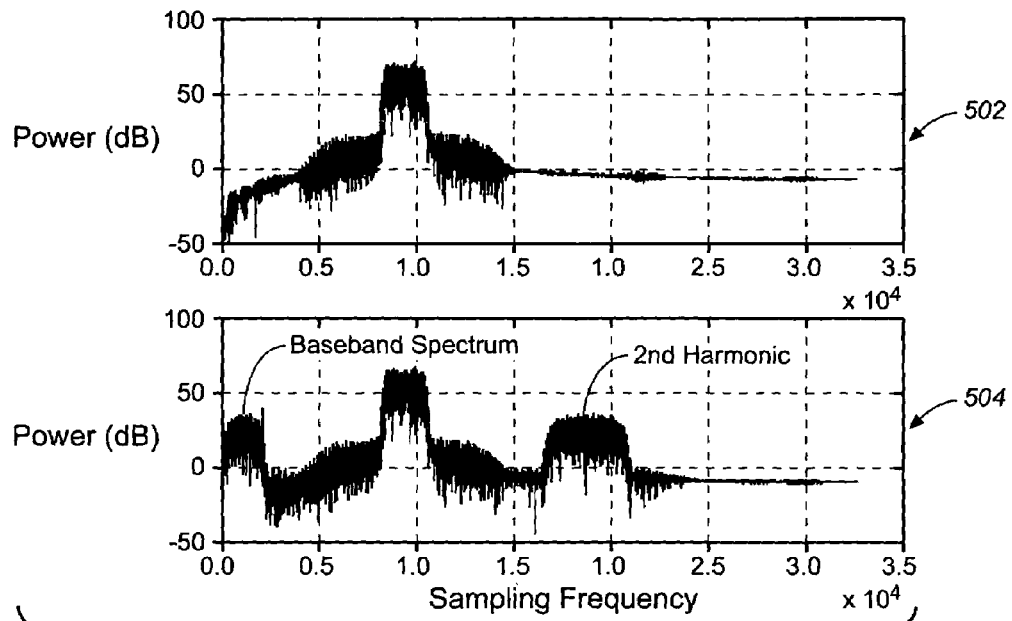
FIG. 5 shows graphs that illustrate the effects of even-order distortion on the power spectral density of a modulation signal, and in particular, a shift of the signal's power to baseband where it can be easily identified.

FIG. 5 shows graphs that illustrate the effects of even-order distortion on the power spectral density of a modulation signal, and in particular, a shift of the signal's power to baseband where it can be easily identified. For the special case where the message signals are constant-amplitude, the baseband signal is simply a dc offset. For example, an input to a circuit with even-order distortion is shown at 502, and the output of that circuit is shown at 504. As a result of the distortion, an increase in baseband and $2^{nd}$ harmonic energy can be seen in the output 504.

Figure 6:
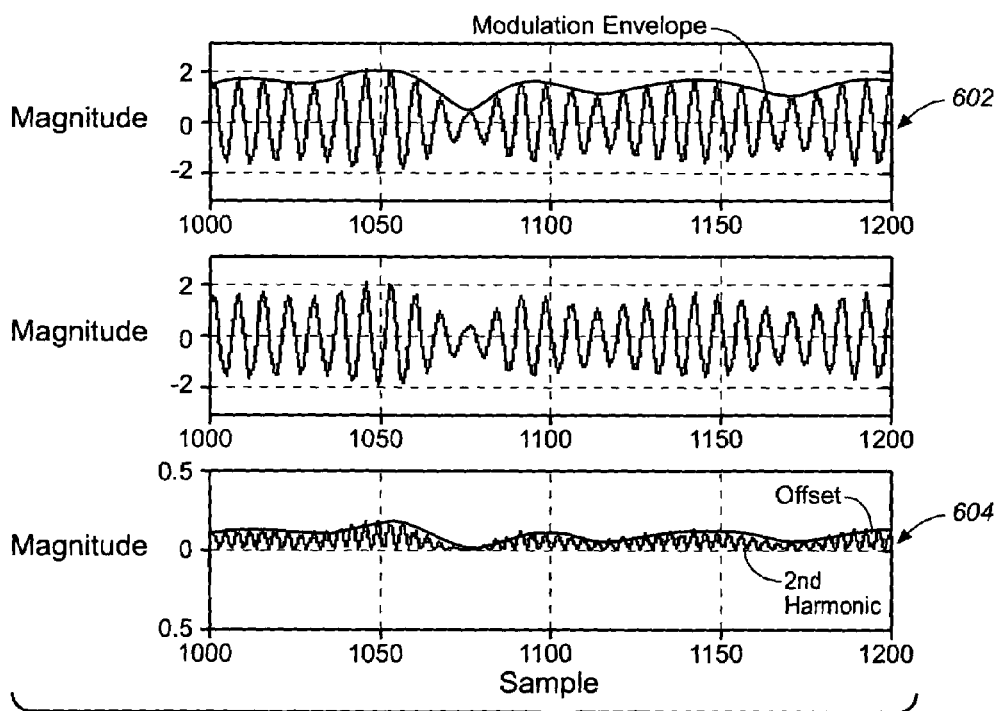
FIG. 6 shows a graph that illustrates the amplitude-shift in the modulation signal when subjected to even-order distortion.

FIG. 6 shows a graph that illustrates the amplitude-shift in a modulation signal 602 when subjected to even-order distortion. For the cases where the message signals are amplitude modulated, a squaring operation shifts the baseband signal positively as shown at 604.

FIG. 7 shows a graph that illustrates the probability distributions of a modulation signal before (702) and after (704) even-order distortion, thereby providing another view of the change in a signal's properties. Clearly, even order distortion alters the mean value of the signal.

Even order distortion becomes problematic when it lowers the signal-to-noise ratio (SNR) of the wanted signal. (Noise generally describes any unwanted energy including thermal, flicker (1/f) and shot noise plus distortion.) The even order distortion is straightforward to measure using the mean value of the signal, which is ideally zero. Any nonzero value indicates even order distortion or a dc offset.

Even order distortion can be reduced through the use of differential circuit techniques. A differential circuit operates on the difference between two input signals. The differential circuit structure couples together two half-circuits and its performance largely depends on the symmetry between these two half-circuits. This symmetry, or balance, can be fairly good in integrated circuit technology.

In a perfectly balanced differential circuit, the even order distortion components generated by each half-circuit are identical, and therefore, cancel when the output difference signal is formed. For example;

$$\Delta v_{out} = v_{out+} - v_{out-}$$

Unfortunately, a perfectly balanced circuit is difficult to realize in practice and any imbalance allows a fraction of the even distortion components to appear in the output difference signal.

The imbalance or lack of symmetry in differential circuits is due to small geometry and doping differences that occur during integrated circuit fabrication. These differences affect the saturation current $I_{sat}$, ideality factor n, forward current gain β, and parasitic elements in bipolar transistors; the threshold voltage $V_T$, mobility μ, transconductance $g_m$, and parasitic elements in MOS transistors; and the values of lumped elements such as resistors, capacitors, and inductors. Furthermore, these mismatches change with temperature and operating voltage.

FIG. 8 shows a diagram of a typical simple emitter-coupled differential pair amplifier. The amplifier consists of two common emitter gain stages biased by a common current source $I_B$. The input signals $v_{in+}$ and $v_{in-}$ steer current through transistors Q1 and Q2 according to $$i_{C1} = \frac{\alpha I_B}{1 + \exp(-\Delta v/nV_T)} \qquad i_{C2} = \frac{\alpha I_B}{1 + \exp(\Delta v/nV_T)}$$

where α is the base transport factor (which is related to the forward current gain β), Δv is the input difference signal, n is the ideality factor, and $V_T$ is the thermal voltage. Even in its most fundamental form, the simple emitter-coupled pair is subject to nonlinearities generated by the exponential term in the above equations.

FIG. 9 shows a diagram of typical a simple source-coupled differential pair amplifier. Its structure is identical to the differential pair amplifier of FIG. 8 but uses MOS transistors instead of bipolar transistors. The output currents $i_{d1}$ and $i_{d2}$ are given by $$i_{d1} = \frac{I_B}{1 + \left(\frac{v_{eff2}}{v_{eff1}}\right)^2} \qquad i_{d1} = \frac{I_B}{1 + \left(\frac{v_{eff1}}{v_{eff2}}\right)^2}$$

where $v_{eff}$ is the effective gate-source overdrive voltage of the MOS transistor. The difference between the output currents $i_{d1}$ and $i_{d2}$ can be expressed as;

$$\Delta i_{out} = \kappa \Delta v \sqrt{\frac{2I_B}{\kappa} - \Delta v^2}$$

where κ is the gain of the gain of the MOS transistor and Δv is the input difference voltage. The square-law behavior of the MOS transistor creates a nonlinear response that is a cause of distortion.

In general, the differential pair amplifier is also plagued by the nonideal properties of the bias current source $I_B$. The emitter-coupled node, or alternatively the source-coupled node (common to both transistors Q1 and Q2), follows the larger input signal (either $v_{in+}$ or $v_{in-}$) and thereby effectively generates the second harmonic of the input difference signal. This modulates the current source and produces a distortion component that is common to each half-circuit. Any imbalance in the two half-circuits allows a fraction of this component to appear as even order distortion in the output difference signal.

Differential amplifiers are also impacted by unbalanced input signals, $v_{in+}$ and $v_{in-}$. Phase and amplitude differences drive the half-circuits of the amplifier differently, creating even order distortion components that do not cancel completely.

Resistor mismatch is another source of imbalance in differential amplifiers. A difference in the input bias resistors shifts the operating bias of the input transistors and their intrinsic gain. Any difference in the output resistors alters the composite gain of each half circuit.

An ideal differential-pair amplifier introduces only odd order distortion, whereas all even order distortion is rejected by the circuit topology. As a result, the mean value of the signal remains zero.

An unbalanced differential amplifier, however, cannot completely reject even order distortion and therefore translates a portion of the modulation signal's energy to baseband. This has the effect of altering the mean value of the signal.

Figure 10:
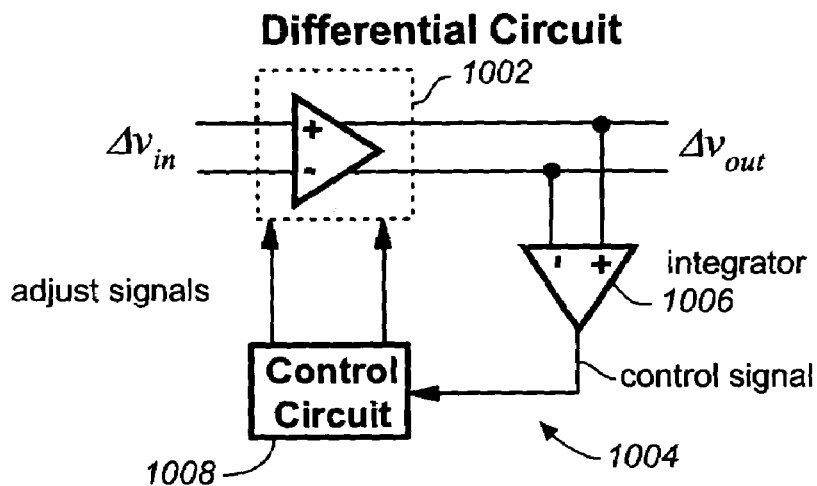
FIG. 10 shows a block diagram of a low-distortion feedback circuit constructed in accordance with the present invention.

FIG. 10 shows a block diagram of a differential circuit 1002 with a feedback circuit 1004 constructed in accordance with the present invention. The feedback circuit operates to lower even-order distortion in accordance with the present invention. The circuit 1004 improves the symmetry of the differential circuit and increases rejection of even-order distortion.

In one embodiment, the circuit 1004 comprises an integrator 1106 and a control circuit 1008. The circuit 1004 separates input and output imbalances and adjusts each independently. One reason for this is that a correction signal acting at only the input or the output can, in some cases, degrade symmetry. Additionally, the feedback circuit 1004 may be further calibrated to achieve higher performance levels.

Figure 11:
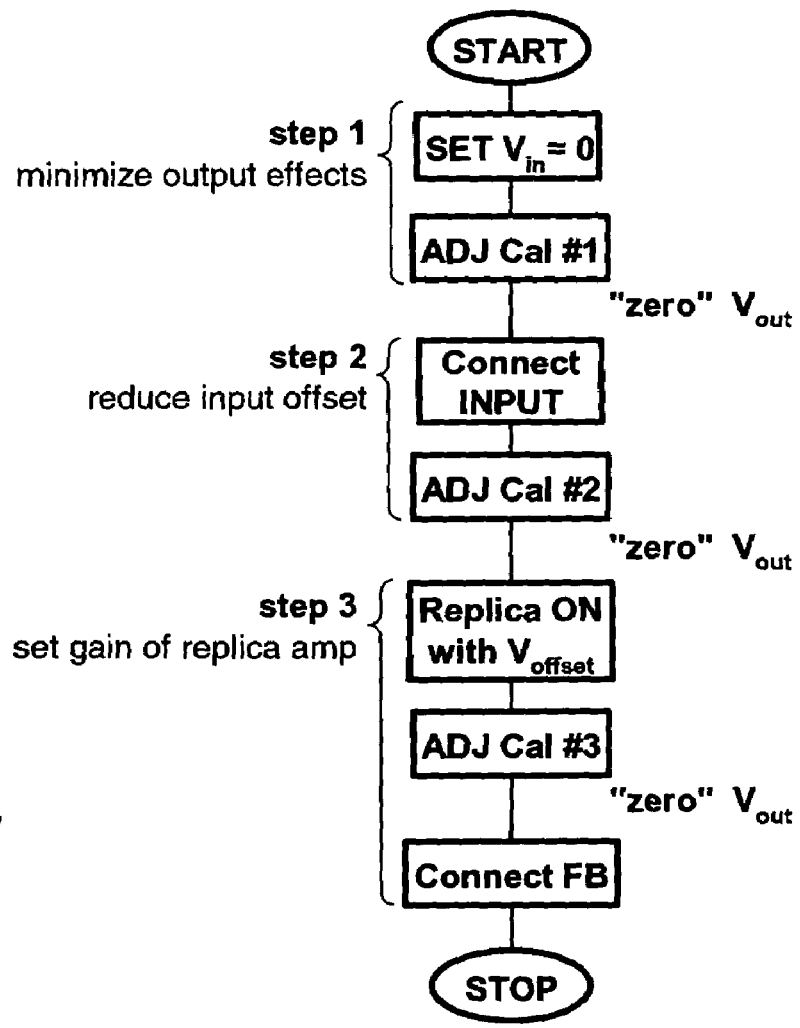
FIG. 11 shows a flow diagram of the calibration steps that may be used to improve the performance of a feedback circuit to minimize even order distortion in accordance with the present invention.

FIG. 11 shows a flow diagram of calibration steps that may be used to improve the performance of a feedback circuit to minimize even order distortion in accordance with the present invention. The operation of the flow diagram will be discussed in the following text, with reference to FIG. 12.

Figure 12:
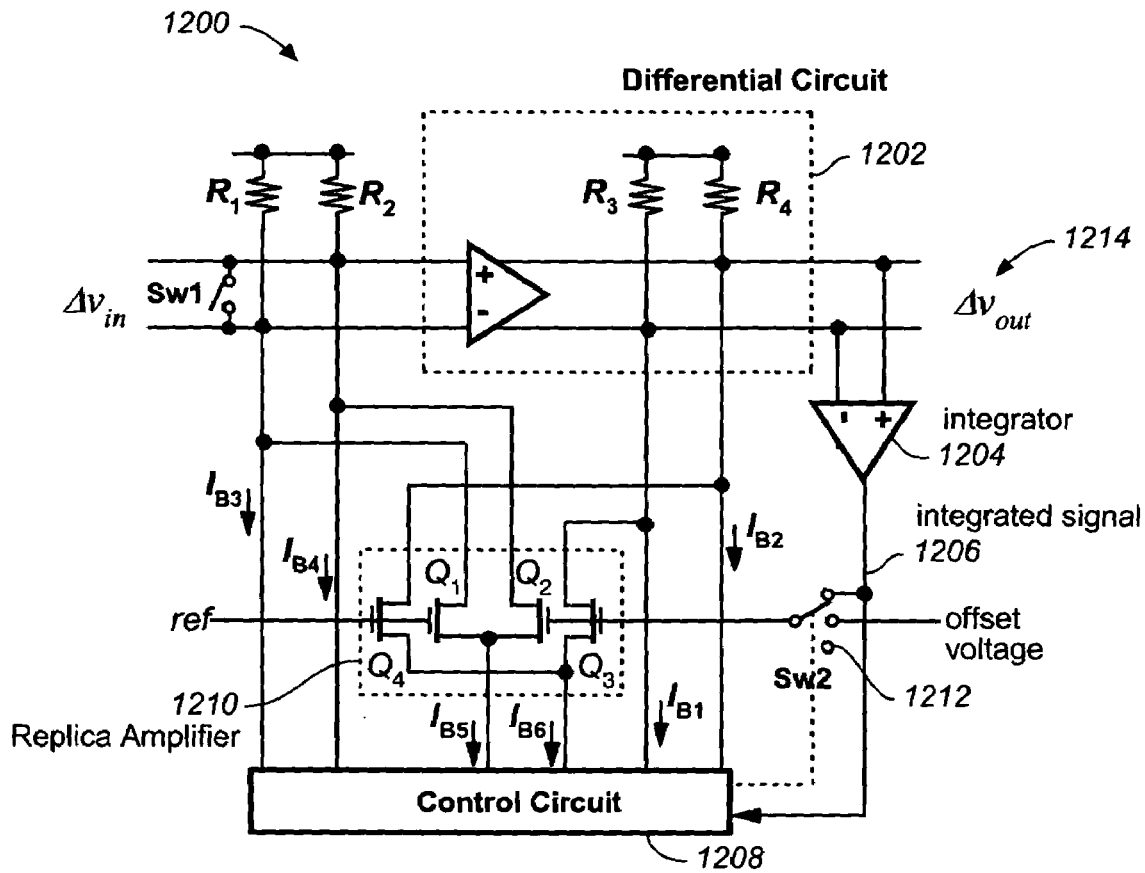
FIG. 12 shows a detailed diagram of a low distortion feedback circuit constructed in accordance with the present invention.

FIG. 12 shows a detailed diagram of a feedback circuit 1200 constructed in accordance with the present invention and applied to a differential amplifier 1202. The circuit operates to correct the offset voltage at the amplifier's output using a controller 1208, which is further described with reference to FIG. 13.

The circuit 1200 includes an integrator 1204, the controller 1208, and a replica amplifier 1210. Also included to facilitate calibration are first and second switches (SW1, SW2). For example, in one embodiment, the controller 1208, the replica amplifier 1210 and the switches (SW1, SW2) form the control circuit 1008 of FIG. 10.

To calibrate the circuit 1200 to achieve improved performance, step 1 of FIG. 11 is performed as follows. The input $\Delta v_{in}$ is set to zero by closing switch SW1. The switch SW2 is set to its lowest tap 1212, which opens a portion of the feedback circuit. The integrator 1204 measures the output signal $\Delta v_{out}$ at 1214, and produces an integrated signal 1206, that directs the controller 1208 to drive currents $I_{B1}$ and $I_{B2}$ to reduce the level of the output difference signal, i.e.

$$\Delta v_{out} = I_{B1}R_3 - I_{B2}R_4$$

This minimizes the effects of output resistors, R3 and R4, and ideality factor n mismatches.

Figure 13:
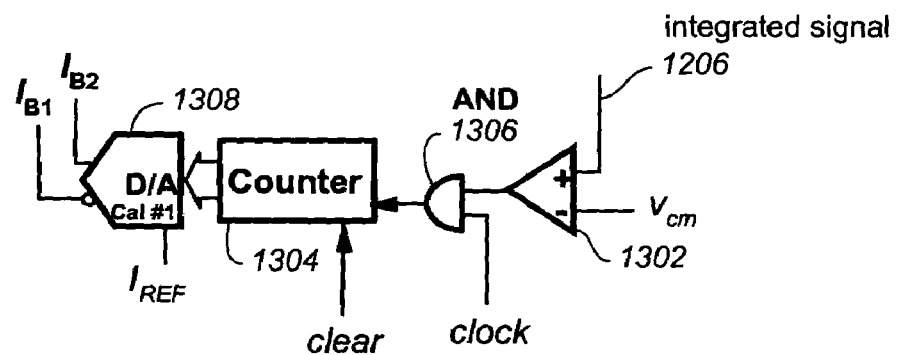
FIG. 13 shows a detailed diagram of a controller for use in the feedback circuit of FIG. 12.

FIG. 13 shows a detailed diagram of a portion of the controller 1208 that receives the integrated signal 1206 that is output from the integrator 1204 and adjusts the bias currents $I_{B1}$ and $I_{B2}$. The controller 1208 includes a comparator 1302, an AND gate 1306, a counter 1304 and a digital to analog (D/A) converter 1308. The D/A converter is provided with a reference current (Iref), and so is able to convert digital values output from the counter 1304 into the currents $I_{B1}$ and $I_{B2}$ based on the reference current Iref.

Ideally, the output of the integrator should be centered at its common mode level $v_{cm}$. A positive integrated signal 1206 output level ($v_{int} > v_{cm}$) indicates the output difference signal 1214 from the differential amplifier 1202 is positive. Similarly, a negative integrated signal 1206 output level ($v_{int} < v_{cm}$) signals a negative output difference signal. The comparator 1302 makes the above determination.

In one embodiment, a comparator replaces the integrator 1204 to provide more accurate calibration settings, since a comparator typically offers higher gain with lower input offset, and thus its output signal may be more accurate than the integrated signal 1206 output from the integrator 1204.

Initially, the counter 1304 is cleared and bias current $I_{B1}$ is maximum while bias current $I_{B2}$ is zero. As such, the output difference signal 1214 of the differential amplifier 1202 will be forced positive. This drives the output of integrator 1204 positive, which drives the comparator 1302 output positive and allows a clock signal to toggle the counter via the AND gate 1306. As the counter value increases, the value of bias current $I_{B2}$ increases and bias current $I_{B1}$ decreases. The clock signal is disabled once the difference signal switches negative and the AND gate 1306 is disabled. The counter now holds the calibration setting to compensate for the output mismatch effects of the differential amplifier 1202.

Next, step 2 of FIG. 11 is performed as follows. The switch SW1 is opened, which allows an input to be connected to the differential amplifier 1202. The controller 1208 includes a second circuit (not shown), identical to that shown in FIG. 13, and having the integrated signal 1206 as input and the currents $I_{B3}$ and $I_{B4}$ as outputs. This second circuit operates to adjust the bias currents $I_{B3}$ and $I_{B4}$ until the output of the integrator 1204 equals its common mode level $v_{cm}$. This step minimizes the offset of the input signal.

Next, step 3 of FIG. 11 is performed as follows. The switch SW2 is positioned to its center position to connect an offset voltage to the circuit so that the gain of the replica amplifier can be adjusted. The offset voltage drives transistors Q1–Q4 and steers unequal currents to resistors R1 and R2, resulting in a difference voltage $\Delta v_{in}$ at the input to the differential amplifier 1202 expressed as $$\Delta v'_{in} = I_{D1}R_1 - I_{D2}R_2$$

The differential amplifier in turn amplifies the difference voltage and produces an output voltage given by $A\Delta v'_{in}$. In parallel, transistors Q3 and Q4 steer currents to resistors R3 and R4 to ideally cancel the effects of the input voltage generated by transistors Q1 and Q2 and resistors R1 and R2.

A third circuit (not shown) is included in the controller 1208 that is identical to the circuit in FIG. 13, and which receives the integrated signal 1206 as input and outputs the currents $I_{B5}$ and $I_{B6}$. The integrator 1204 measures the output signal and drives current sources $I_{B5}$ and $I_{B6}$ to reduce the output difference signal $\Delta v_{out}$ and thereby achieve the desired cancellation $$\Delta v_{out} = I_{D3}R_3 - I_{D4}R_4 \rightarrow A\Delta v'_{in}$$

and set the gain of feedback circuit.

$$\frac{I_{B6}}{I_{B5}} = A\frac{R_1}{R_3}$$

After calibration of the output effects, the input offset, and the gain of the replica amplifier, the feedback circuit is activated by positioning switch SW2 to its first tap position to connect the integrated signal 1206 to the replica amplifier 1210 input. The integrator 1204 monitors the differential amplifier's output signal 1214 and outputs an integrated signal that is an approximation of the output signal's 1214 mean value. The integrated signal 1206 is connected to the input terminals of transistors Q2 and Q3 and introduces an input offset voltage to the differential amplifier that lowers even order distortion.

Figure 14:
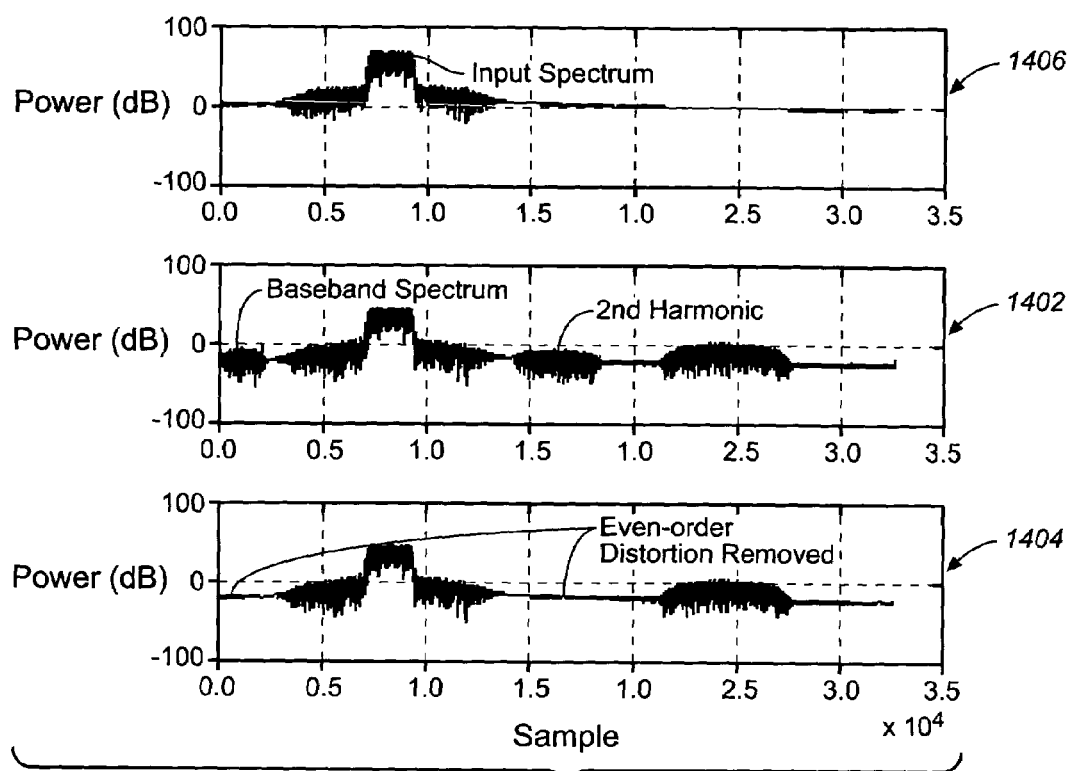
FIG. 14 shows a graph that illustrates the operation of an unbalanced differential pair amplifier, with and without a feedback circuit, in accordance with the present invention.

FIG. 14 shows a graph that illustrates the output 1402 of an unbalanced differential pair amplifier without the disclosed feedback circuit, and the output 1404 with the disclosed feedback circuit 1200 in accordance to the present invention. As shown in FIG. 14, given the input signal 1406, the baseband spectrum and second harmonic caused by even order distortion is clearly present in the output 1402, however, in the output 1404, these effects vanish when the feedback circuit 1200 is applied in accordance with the present invention.

Therefore, a feedback circuit constructed in accordance with the present invention adjusts the symmetry of differential amplifiers by controlling key input and output parameters. A three-step calibration process, using only DC levels, easily corrects for output mismatches, lowers input offset, and sets the gain of the feedback circuit. The feedback loop operates continuously to remove the effects of circuit mismatches, which may change with signal level, temperature, or voltage supply. Furthermore, the embodiments are effective for various types of transistors and are not limited to the specific realizations shown.

The present invention includes a differential feedback system that minimizes even order distortion of a differential circuit. The embodiments described above are illustrative of the present invention and are not intended to limit the scope of the invention to the particular embodiments described. Accordingly, while several embodiments of the invention has been illustrated and described, it will be appreciated that various changes can be made therein without departing from the spirit or essential characteristics thereof. Accordingly, the disclosures and descriptions herein are intended to be illustrative, but not limiting, of the scope of the invention, which is set forth in the following claims.

What is claimed is:

1. A feedback circuit for use with a differential circuit, the feedback circuit comprising:
   a comparator configured to receive differential output signals produced by the differential circuit and produce a comparator output signal; and
   a controller that receives the comparator output signal and produces differential current signals that are coupled to the differential output signals, so as to control the differential circuit to reduce even-order distortion.

2. The feedback circuit of claim 1, wherein the controller is configured to produce second differential current signals that are coupled to differential input signals that are input to the differential circuit.

3. The feedback circuit of claim 1, further comprising a replica amplifier that is coupled between the controller and the differential circuit.

4. The feedback circuit of claim 3, wherein the controller is configured to produce second differential current signals that are coupled to the replica amplifier.

5. The feedback circuit of claim 3, further comprising a switch for selectively coupling the replica amplifier to the comparator output signal.

6. A method for operating a feedback circuit that is coupled to a differential circuit to reduce even-order distortion associated with a differential circuit, and the method comprises:
   adjusting the feedback circuit to compensate for output mismatch effects of the differential circuit;
   adjusting the feedback circuit to reduce input offset effects of the differential circuit; and
   adjusting the feedback circuit to set a gain factor of the differential circuit.

7. The method of claim 6, wherein said adjusting the feedback circuit to compensate for output mismatch effects of the differential circuit, comprises:
   setting an input to the differential circuit to zero; and
   adjusting bias currents coupled to a differential output of the differential circuit.

8. The method of claim 6, wherein said adjusting the feedback circuit to reduce input offset effects of the differential circuit, comprises:
   setting an input to the differential circuit to a selected level; and
   adjusting bias currents coupled to the input of the differential circuit.

9. The method of claim 6, wherein said adjusting the feedback circuit to set a gain factor of the differential circuit, comprises:
   setting an input to a replica amplifier to a selected level, wherein the replica amplifier is coupled to the differential circuit; and
   adjusting bias currents coupled to the replica amplifier.

* * * * *